United States Patent [19]
Dekker et al.

[11] Patent Number: 5,753,537
[45] Date of Patent: May 19, 1998

[54] METHOD OF MANUFACTURING A SEMICONDUCTOR DEVICE FOR SURFACE MOUNTING

[75] Inventors: Ronald Dekker; Henricus G. R. Maas; Martinus P. J. G. Versleijen, all of Eindhoven, Netherlands

[73] Assignee: U.S. Philips Corporation, NY, N.Y.

[21] Appl. No.: 792,338

[22] Filed: Jan. 31, 1997

Related U.S. Application Data

[63] Continuation of Ser. No. 506,621, Jul. 25, 1995.

[30] Foreign Application Priority Data

Jul. 26, 1994 [EP] European Pat. Off. ............. 94202182

[51] Int. Cl.⁶ .................... H01L 21/44; H01L 21/60
[52] U.S. Cl. .................... 438/113; 438/125; 438/461; 438/611; 257/522
[58] Field of Search .................... 257/522; 438/113, 438/125, 461, 611

[56] References Cited

U.S. PATENT DOCUMENTS

| | | |
|---|---|---|
| 3,370,204 | 2/1968 | Cave . |
| 3,475,664 | 10/1969 | De Vries . |
| 3,493,820 | 2/1970 | Rosvold . |
| 3,543,106 | 11/1970 | Kern .................... 317/235 |
| 3,616,345 | 10/1971 | Van Dijk Emmasingel . |
| 3,616,348 | 10/1971 | Greig . |
| 3,623,219 | 11/1971 | Stoller et al. . |
| 4,070,230 | 1/1978 | Stein . |
| 4,131,985 | 1/1979 | Greenwood et al. . |
| 4,601,779 | 7/1986 | Abernathy et al. . |
| 4,612,408 | 9/1986 | Moddel et al. . |
| 4,892,842 | 1/1990 | Corrie et al. . |
| 4,918,505 | 4/1990 | Blouke . |
| 5,144,747 | 9/1992 | Eichelberger . |
| 5,162,251 | 11/1992 | Poole et al. . |
| 5,233,219 | 8/1993 | Shimoji et al. .................... 257/623 |
| 5,356,947 | 10/1994 | Ali et al. . |
| 5,403,729 | 4/1995 | Richards et al. .................... 437/182 |

OTHER PUBLICATIONS

Wolf, "Silicon Processing for the VLSI Era" vol. 2: Process Integration pp. 87–89, 1990.

"VSLI Technology" by S.M. Sze, Chapter 13, p. 569, 2nd Edition, Mc–Graw Hill Book Company 1988.

*Primary Examiner*—Jey Tsai
*Assistant Examiner*—Kevin F. Turner
*Attorney, Agent, or Firm*—Brian J. Wieghaus

[57] ABSTRACT

The invention relates to a method of manufacturing a semiconductor device (1) for surface mounting. Such a method is known, whereby such a semiconductor device is manufactured in that a semiconductor body with a semiconductor element is mounted on a metal lead frame with metal package leads, after which contact surfaces of the semiconductor element are connected to the package leads by means of bonding wires. It is found that semiconductor devices of small dimensions are difficult to realize by this known method, while in addition the manufacture of integrated circuits with very many package leads is comparatively expensive owing to the many connections which are to be made between the integrated circuits and the package leads. According to the invention, the semiconductor devices are packaged while they are still on a slice of semiconductor material, while the package leads are formed from the semiconductor material. In the method according to the invention, the semiconductor devices are manufactured without the necessity of a lead frame, bonding wires, or metal package leads. Thanks to the IC technologies at the wafer level, such as photolithography, etching, etc., the method according to the invention renders possible semiconductor devices of very small dimensions. In addition, integrated circuits with very many package leads can be manufactured in a simple manner without additional steps being necessary. The method according to the invention is thus comparatively inexpensive.

9 Claims, 4 Drawing Sheets

METHOD OF MANUFACTURING A SEMICONDUCTOR DEVICE FOR SURFACE MOUNTING

This is a continuation of application Ser. No. 08/506,621, filed Jul. 25, 1995.

BACKGROUND OF THE INVENTION

The invention relates to a method of manufacturing a semiconductor device for surface mounting and to a semiconductor device for surface mounting.

Such a device is known from S.M. Sze: "VLSI Technology", Chapter 13, p. 569, 2nd edition, Mc-Graw-Hill Book Company 1988. Devices for surface mounting, or "surface mounted devices" (SMDS) have the advantage over conventional components that SMDs are provided on a surface of a printed circuit board without package lead having to be passed through holes in the printed circuit board, as is the case with conventional components. SMDs are manufactured in that a semiconductor body comprising a semiconductor element is mounted on a metal lead frame with metal package leads, after which contact surfaces of the semiconductor element are connected to the package leads by means of bonding wires. The semiconductor body and a portion of the package leads are then enveloped in an epoxy resin coating. Usually, SMDs are fixed to the surface of the printed circuit board with a drop of glue, after which an electrical connection between the package leads and conductor tracks on the printed circuit board is achieved by soldering. The metal package leads in known SMDs are adapted, for example by means of a bent shape or "gull wing", so as to render possible a better contact between a conductor track and the package lead.

The known method has the disadvantage that semiconductor devices of small dimensions are very difficult to realize, while in addition semiconductor devices provided with integrated circuits with very many package leads are comparatively expensive owing to the many connections to be made between the integrated circuits and the package leads.

SUMMARY OF THE INVENTION

The invention has for its object inter alia to provide a method by which very small semiconductor devices for surface mounting can be manufactured in a comparatively inexpensive manner.

According to the invention, the method is for this purpose characterized in that a slice of a semiconductor material is provided with semiconductor elements and lead regions at a first of its two sides, conductor tracks are provided between semiconductor elements and lead regions at the first side, the first side of the slice is provided with a coating, the lead regions are separated from the semiconductor elements, and the slice is subdivided into individual semiconductor devices with package leads which comprise portions of the slice in which the lead regions are present.

In semiconductor devices manufactured by the method according to the invention, the conductor tracks on the first side achieve an electrical connection between, for example, contact faces of the semiconductor element and package leads of semiconductor material. This is in contrast to conventional semiconductor devices where bonding wires achieve a connection between the contact faces and metal package leads.

The coating on the first side protects the semiconductor element and the conductor tracks against ambient influences, so that no corrosion or degradation of the semiconductor element and of the conductor track takes place. The semiconductor elements and the lead regions are mutually separated in that, for example, the semiconductor material is removed or rendered insulating between the semiconductor elements and the lead regions, and in that the slice is subdivided into individual semiconductor devices. The package leads are directly formed from semiconductor material of the slice in this case. The package leads comprise the lead regions which ensure a good electrical connection between the conductor track and the second side. The second side of the semiconductor device is comparatively plane, so that the semiconductor device is suitable for surface mounting. The semiconductor device is then finally mounted with its second side, for example, on a printed circuit board. The package leads thus make electrical and thermal contact with conductor tracks on the printed circuit board. The second side of the package leads may for this purpose be provided with a metallically conducting layer such as, for example, a metal layer or a conductive glue layer.

It is also advantageously possible by the method to manufacture further package leads, for example from portions of the slice in which the semiconductor elements are present. A portion of the semiconductor element then is in electrical or thermal contact directly, i.e. without the use of a conductor track, with a conductor track on the printed circuit board after mounting.

In the method according to the invention, the semiconductor devices are manufactured without a lead frame, bonding wires, or metal package leads being necessary. Known SMDs are given a final mounting by means of mechanical bonding machines, which means that the dimensions of known SMDs must be comparatively great. The manufacture of semiconductor devices according to the invention takes place when the devices are still present in a slice of semiconductor material. Owing to the IC technologies at wafer level such as photolithography, etching, etc., the method according to the invention renders possible semiconductor devices of very small dimensions. In addition, semiconductor devices may be provided with integrated circuits comprising very many package leads in a simple manner without additional steps being necessary. The method according to the invention is thus comparatively inexpensive.

An additional advantage is obtained when the first side is provided with an insulating layer on which the conductor tracks are provided, after which the coating is provided and subsequently the slice is subjected to a bulk reducing treatment over the entire surface area of its second side, and the lead regions are separated from the semiconductor elements in that material is removed from the slice selectively from the second side, the insulating layer being used as a stopper layer during this. The slice is thinned by the bulk reducing treatment from the second side, for example, in that the slice is ground to thinness in known manner or etched, preferably down to a thickness which lies between a few tenths of a micrometer and a few micrometers. Such a thin slice ensures comparatively low capacitance values in the semiconductor element between portions of the semiconductor element and the bulk of the slice, so that the semiconductor element is suitable for high frequencies. Moreover, the series resistance in the package leads from the first to the second side is comparatively small in a thin slice. The coating ensures that the thinned slice is nevertheless comparatively strong mechanically, so that it can be conveniently handled. It is also comparatively simple in a thinned slice to provide a separation between lead regions and semiconductor elements. The selective removal of material may be achieved, for example, through etching away by means of an etching mask or through selective evaporation by means of a laser. The material of the insulating layer is so chosen in dependence on the semiconductor material that the semiconductor material is removed whereas the insulating layer is not. Such combinations of semiconductor material and insulating layer are known; for example, the following material combinations may be used: GaAs and silicon nitride; silicon and silicon oxide or silicon nitride. Preferably, silicon is used as the semiconductor material. The insulating layer may then be, for example, a nitride or oxynitride layer. Preferably, a silicon oxide layer is provided as the insulating layer. The manufacturing process of the semiconductor device may then be readily incorporated in existing manufacturing processes without additional steps being necessary for providing the insulating layer.

Preferably, a mask is provided at the second side for removing the semiconductor material between the semiconductor elements and the lead regions. This mask may comprise, for example, an alloy such as titanium/tungsten. A layer comprising gold is preferably provided on the second side in the method, which layer is patterned by photolithographical techniques, after which the lead regions and the semiconductor regions are separated through etching away of semiconductor material, the patterned layer comprising gold being used as an etching mask. The photolithographical mask is aligned, for example, in that infrared light is used for viewing through the mask, slice, and coating.

The layer comprising gold is highly suitable as an etching mask because it allows the use of prolonged, comparatively strongly etching operations. The patterned layer comprising gold may in addition serve directly as a metallization of the package lead, so that the package lead may be soldered directly, for example, to a printed circuit board.

Preferably, the semiconductor material comprises silicon, and the lead region is separated from the semiconductor element through etching of the slice in KOH. Etching with KOH leads to well-defined edges of the lead and contact regions, i.e. edges having a slope of approximately 55° to the second side.

The coating may be taken comparatively thick and mechanically stiff in order to render the semiconductor device mechanically sufficiently strong. It is advantageous when the coating comprises a comparatively stiff cover plate. For example, a silicon slice or a ceramic plate may be taken for such a covering plate. The covering plate is provided, for example, by wafer bonding or gluing. It is advantageous to take a thermosetting glue so that the connection between the semiconductor slice and the covering plate is stable also at elevated temperatures. Preferably, the coating comprises an insulating covering plate. Such a covering plate has the advantage that the high-frequency properties of the semiconductor device are favourably affected because there is no capacitive coupling between conductor tracks and the covering plate. Preferably, the method according to the invention is characterized in that an UV (ultraviolet radiation) curing glue is provided as the coating with a glass plate as the insulating covering plate thereon, after which the glue is cured with UV radiation through the glass plate. A UV-curing glue can be cured at room temperature in a very short time. The glue has the advantage that no solvents are present therein, so that no cavities are formed in the glue layer between the glass plate and the semiconductor slice. The glass plate is split up simultaneously with the slice, so that each semiconductor device is provided with a portion of the glass plate at its first side. The use of a glass plate has many advantages. Glass is cheap, stiff, widely available, protects the semiconductor device against external influences, and has a smooth surface. Owing to the application of the glass plate, the semiconductor device is much sturdier during the removal of semiconductor material from the second side of the slice and after its manufacture has ended, so that fewer rejects will occur during operations. Since the UV-curing glue is also transparent, the semiconductor elements remain visible through the glass plate and the glue layer, so that operations such as alignment for the separation of the semiconductor elements and lead regions and for the subdivision of the slice into individual devices are simple.

An additional advantage is obtained when the semiconductor elements and/or the lead regions are provided with contact regions, which adjoin the first side and comprise a quantity of dopant atoms of more than $10^{19}/cm^3$, before the conductor tracks are provided. A low-ohmic contact may be made between a conductor track and such a comparatively strongly doped contact region. Preferably, the lead regions extending from the first to the second side are provided with a quantity of dopant atoms of more than $10^{19}/cm^3$. The package leads are then comparatively low-ohmic, so that a good electrical connection between the conductor tracks at the first side and the second side of the slice is created. The semiconductor device is mounted with this second side on a printed circuit board. There will be a good electrical connection then between the semiconductor element and the printed circuit board. It is not always necessary to use a strongly doped contact region, for example, if the semiconductor element is provided with a Schottky diode between the conductor track at the first side and the semiconductor material of the slice.

The invention also relates to a semiconductor device for surface mounting. According to the invention, the semiconductor device comprises a covering plate on which a body of a semiconductor material and package leads are provided each with a first of their two sides, said leads being insulated from said body and being made of the semiconductor material, while the body is provided at the first side with a semiconductor element which is connected to the first side of the package leads via conductor tracks, and the second sides of the package leads opposed to the first lie in one plane. The semiconductor device according to the invention may be manufactured by the method disclosed above with very small dimensions. In addition, semiconductor devices provided with integrated circuits having very many package leads may be manufactured in a simple manner without the necessity of extra steps such as, for example, the application of many bonding wires. The semiconductor device according to the invention is thus comparatively inexpensive.

BRIEF DESCRIPTION OF THE DRAWING

The invention will be explained in more detail below by way of example with reference to the drawing, in which.

DESCRIPTION OF THE PREFERRED EMBODIMENT

Figure 5:
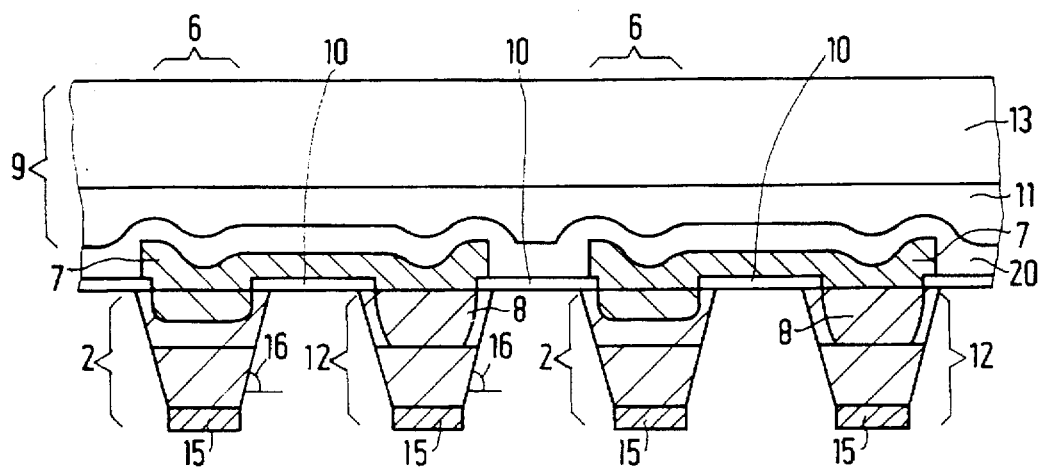
Figure 6:
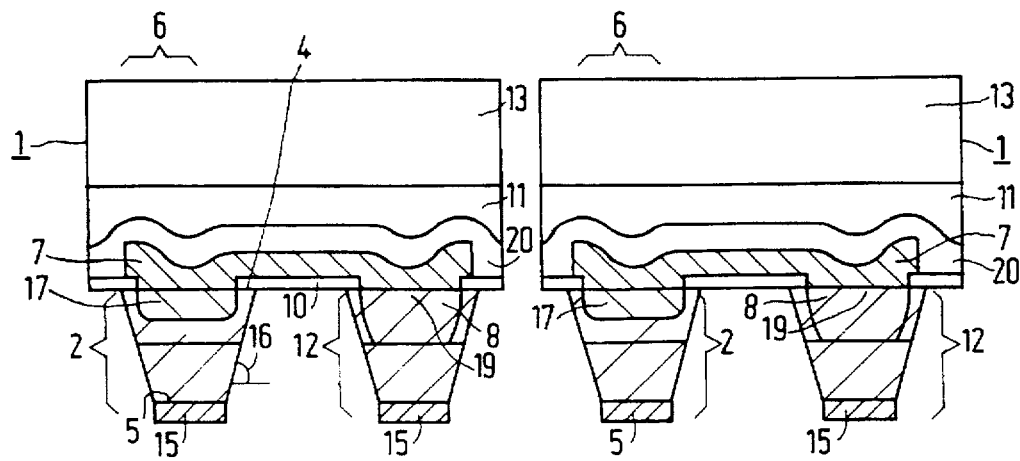

FIG. 6 shows a semiconductor device 1 with package leads 2, 12 of semiconductor material. FIGS. 1 to 6 show how such a semiconductor device 1 is manufactured. For this purpose, a slice 3 of the semiconductor material is provided with a semiconductor element 6 at a first side 4 of its two sides 4, 5 (see FIG. 1). Two semiconductor elements 6 are shown. In practice, many semiconductor elements 6 are provided in the slice 3. In this example the slice 3 is a silicon slice comprising an $n^+$ substrate (doping $10^{19}$/cm$^3$) provided with an $n^-$type layer which was provided epitaxially (thickness 3 µm, doping $10^{15}$/cm$^3$). A diode semiconductor element 6 is provided in known manner in the slice 3 in that a $p^+$ region 17 (doping $10^{20}$/cm$^3$) is provided by diffusion, a pn junction being formed between $p^+$ region 17 and the $n^-$ epitaxial layer.

Figure 1:
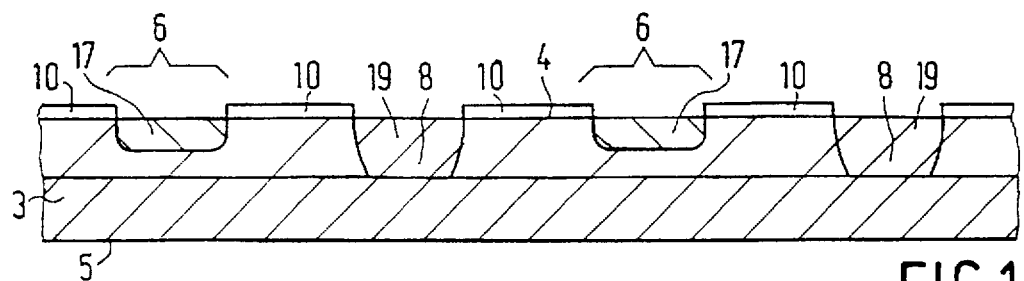
FIGS. 1 to 6 show in cross-section a diode semiconductor device manufactured by the method according to the invention in various stages of manufacture.

The lead region 8 is provided with a contact region 19 with a quantity of dopant atoms of more than $10^{19}$/cm$^3$ (see FIG. 1). A comparatively low-ohmic contact may then be manufactured between a conductor track 7 to be provided later and such a comparatively strongly doped contact region 19. The $p^+$ region 17 in this example at the same time acts as a contact region for the semiconductor element 6. Preferably, the lead region 8 extending from the first side 4 to the second side 5 is provided with a quantity of dopant atoms more than $10^{19}$/cm$^3$. In this example, the lead region 8 is formed by the $n^+$ region 19 and the $n^+$ substrate of the slice 3. The lead region 8 is then comparatively low-ohmic, so that a good electrical connection between the first side 4 and the second side 5 of the slice is created.

The first side 4 is provided with an insulating layer 10. When silicon is used as the semiconductor material, for example, silicon nitride or silicon oxynitride may be used for the insulating layer 10. In this example, a silicon oxide layer is provided as the insulating layer 10. The manufacturing process of the semiconductor device 1 may then be readily incorporated in existing manufacturing processes, without extra steps being necessary for the provision of the insulating layer 10. The silicon layer 10 in this example is of the so-called LOCOS type. To provide such an insulating layer 10, the silicon of the slice 3 is oxidized in known manner through a silicon nitride mask by exposure of the slice 3 to wet oxygen for five hours at 1000° C. A 1 µm thick layer of silicon oxide 10 is created thereby.

Figure 2:
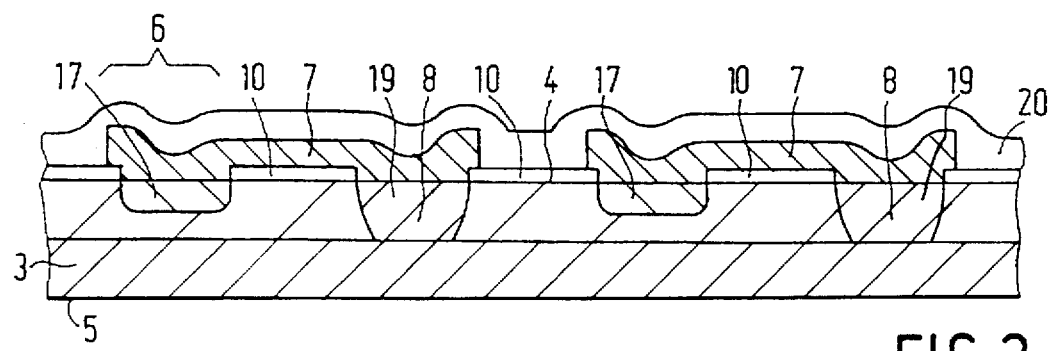
Figure 3:
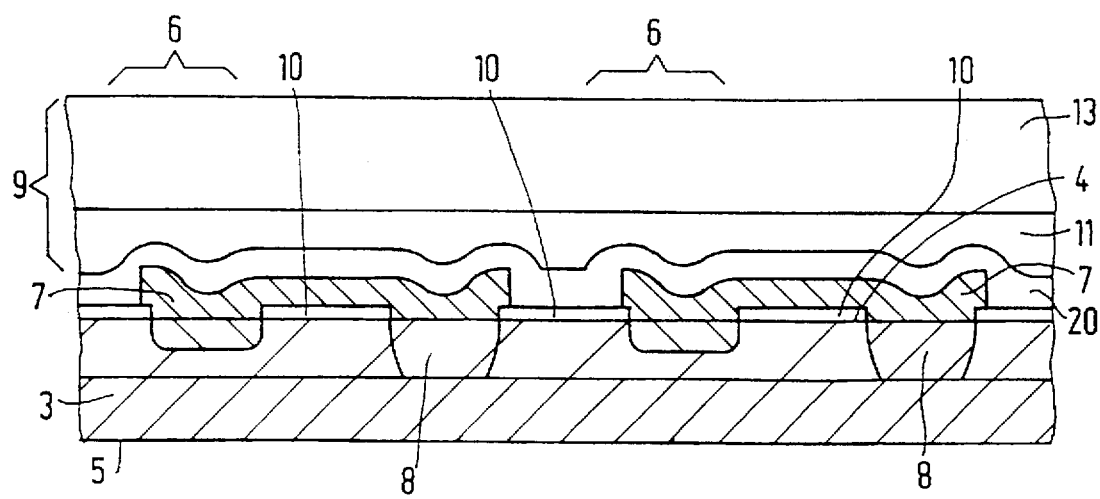

A conductor track 7 is provided on the insulating layer 10 between the semiconductor element 6 and a lead region 8 (see FIG. 2). The conductor track 7 makes electrical contact with the semiconductor element 6 and with the lead region 8 via contact holes in the insulating layer 10. The conductor track 7 comprises gold. A 0.1 µm Ti layer, a 0.1 µm Pt layer and a 1.0 µm Au layer are provided on the surface 4 in a sputtering process. These layers are subsequently patterned in known manner by photolithographical techniques. An anti-scratch layer 20 of silicon nitride is provided in known manner over the conductor tracks 7. The first side 4 of the slice is then provided with a coating 9 (see FIG. 3). To render the semiconductor device 1 mechanically sufficiently strong, the coating 9 may be taken comparatively thick or mechanically comparatively stiff, for example, through the use of a thick layer of synthetic resin, or a comparatively thin layer of synthetic resin which is filled with a ceramic material such as glass globules. It is advantageous when the coating 9 comprises a comparatively stiff covering plate 13. For such a covering plate 13, for example, a silicon slice or ceramic plate may be taken. The covering plate is provided, for example, by wafer bonding or by means of a glue layer 11. An insulating covering plate 13 has the advantage that the high-frequency properties of the semiconductor device are favourably affected because there is no capacitive coupling between conductor tracks and the covering plate. It is advantageous to take a thermosetting glue for the glue layer 11. Such a glue does not or substantially not soften at an elevated temperature, so that the connection is stable also at an elevated temperature. Preferably, a UV-curing glue is provided as the coating 9 in the method according to the invention, with a glass plate 13 thereon, the glue 11 being cured with UV radiation through the glass plate 13. It is achieved thereby that the semiconductor device 1 is much stronger during the removal of semiconductor material from the second side 5 of the slice 3 and after its completion, so that fewer rejects will occur during the operations. A UV-curing glue can be cured at room temperature in a very short time. The glue has the advantage that no solvents are present therein, so that no cavities can be formed in the glue layer between the glass plate 13 and the semiconductor slice 3 owing to evaporation of solvents. Moreover, this glue will only harden when no oxygen is present. This means that glue which happens to be present in locations other than between the glass plate 13 and the slice 3 during manufacture can be easily removed, because this glue is not cured owing to the presence of oxygen in the air. A synthetic resin glue such as an epoxy or acrylate glue may be used as the UV-curing glue. In the present example, hexanediole diacrylate 1.6 is used.

A Pyrex plate with a thickness of 1 mm is used as the glass plate in this example. Alternatively, for example, a ceramic plate may be used as the covering plate 13. It is sufficient when the covering plate has a comparatively low transmissivity to UV radiation. The UV-curing glue 11 can be cured with only a small quantity of UV radiation. Alternatively, it is possible to cure the UV-curing glue in a treatment at elevated temperature. Curing with UV radiation, however, is simpler than curing at elevated temperature. The covering plate is allowed to have a coefficient of expansion which is different from that of the semiconductor material of the slice 3. No major temperature changes are used in the subsequent process steps, so differences in expansion between covering plate 13 and slice 3 will be small and will be compensated by the glue layer 11.

In practice, the slice of semiconductor material 3 is made thin after the provision of the covering 9 in that material is removed from the second side 5 of the slice 3. In this example, the thickness of the slice 3 is reduced to approximately 10 µm through grinding from the second side 5.

Figure 4:
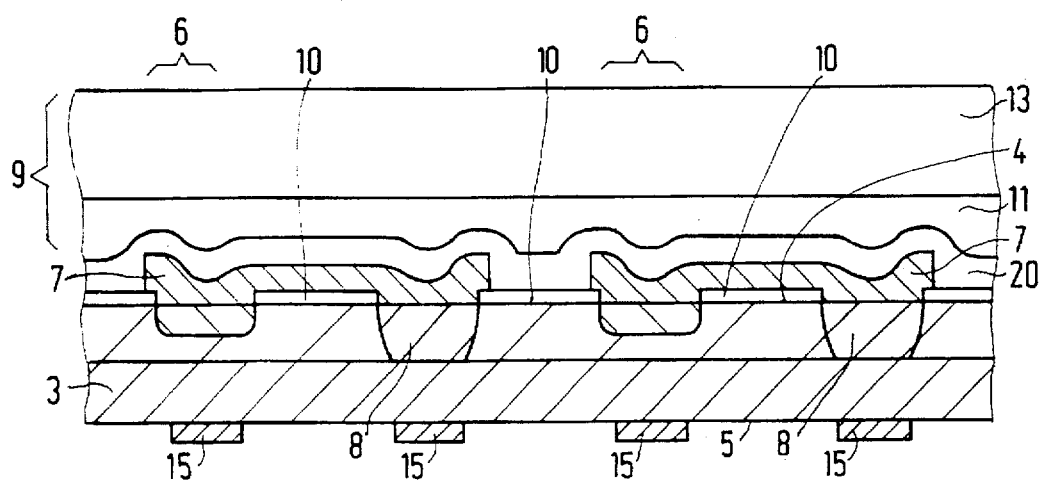

FIGS. 4, 5 and 6 show how subsequently the lead region 8 is separated from the semiconductor element 6 in that material is selectively removed from the slice 3 at the second side 5, the insulating layer 10 being used as a stopper layer according to the invention. The thinned slice 3 is for this purpose provided with a conductive layer at the second side 5, which layer is patterned with a mask. The mask is aligned in that infrared light is used for viewing through the mask, the slice, and the covering plate. FIGS. 4, 5 show how the patterned metal layer 15 is subsequently used as a mask for separating the lead region 8 and the semiconductor element 6. The metal layer 15 is much more suitable as a mask than a usual mask obtained by photolithography. It allows for the use of strong etching operations, possibly at a comparatively high temperature, while at the same time this metal layer serves as a metallization at the second side 5.

An additional advantage is obtained in the separation of the semiconductor element 6 and the lead region 8 at the second side 5 when the patterned conductive layer 15 comprises gold. In the present example, a 0.1 µm Ti layer, a 0.1 µm Pt layer, and a 1.0 µm Au layer are provided on the second side in a sputtering process. These layers are then patterned in known manner by photolithographical techniques. The lead region 8 is subsequently separated from the semiconductor element 6 through etching of the slice in KOH. The gold of the patterned conductive layer 15 is highly resistant to KOH. Etching with KOH leads to very well-defined edges of the lead and contact regions, i.e. edges which have a slope 16 of 54.75° to the second side 5 (see FIGS. 5 and 6). Etching stops automatically the moment the insulating layer 10 is reached. The package leads may thus be very accurately defined.

The semiconductor slice 3 provided with the coating 9 is then subdivided into individual semiconductor devices 1 with package leads 2, 12, formed by portions 2 of the slice 3 in which the semiconductor element 6 is present and portions 12 of the slice 3 in which the lead region 8 is present (see FIG. 6). The covering plate 13 is split up simultaneously with the slice 3, so that each semiconductor device 1 is provided with a portion of the covering plate 13 at its first side 4.

Such a method is particularly suitable for the manufacture of semiconductor devices for surface mounting, so-called surface mounted devices or SMDs.

The dimensions of such a semiconductor device can be adapted so as to conform to standard dimensions for SMDs. The height of the semiconductor device may thus be adapted in that a different thickness is taken for the covering plate 13. The semiconductor device in the present example is manufactured to a standard dimension 0402 for SMDs (dimensions 0.04×0.02×0.02 inches, 1×0.5×0.5 mm). The semiconductor device 1 is mounted with its second side 5, i.e. with the gold layer 15, on a printed circuit board in the case of surface mounting. A satisfactory connection between the semiconductor element 6 and the printed circuit board is achieved thereby.

Figure 7:
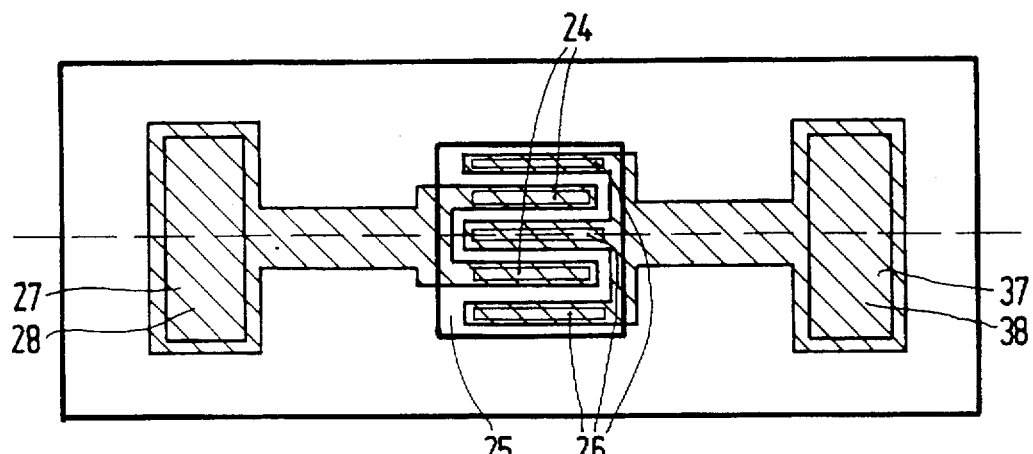
FIGS. 7 to 9 show a transistor semiconductor device manufactured in accordance with the invention, FIG. 7 being a plan view of the first side, FIG. 8 a bottom view of the second side, and FIG. 9 a cross-section.
Figure 8:
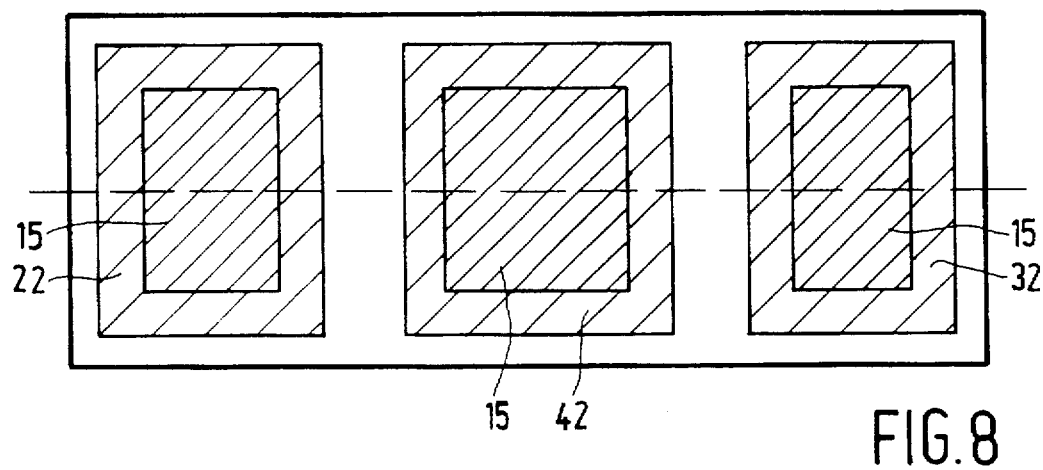
Figure 9:
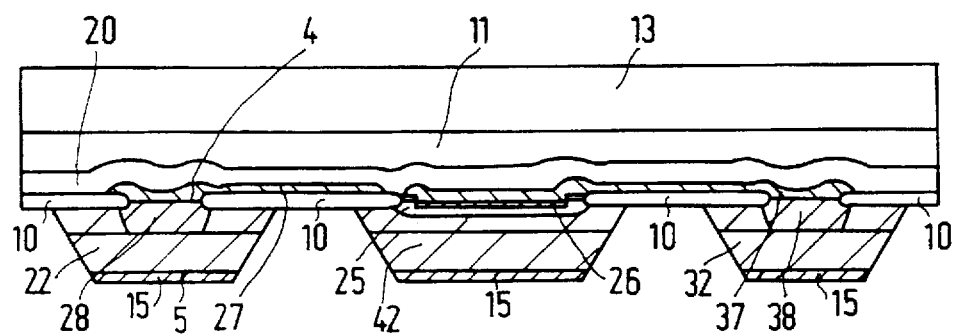

FIGS. 7 to 9 show a semiconductor device with a transistor as the semiconductor element by way of second embodiment. This transistor is manufactured in a manner analogous to that of the diode in the first embodiment of FIGS. 1 to 6. FIG. 7 is a plan view of the first side 4, FIG. 8 a bottom view of the second side 5, and FIG. 9 a side elevation of this transistor. Such a transistor is manufactured from a slice of silicon 3 comprising an $n^+$ substrate provided with an $n^-$ epitaxial layer. This slice 3 is provided with a silicon oxide layer in known manner, which layer is provided with contact holes for the lead regions 28 and 38 by a photolithographical method with a comparatively coarse mask. Then the regions 28 and 38 are formed in known manner through these contact holes by diffusion of n-type dopant atoms. $N^+$ regions which continue from the side 4 to the side 5 are formed thereby. In a next step, the LOCOS regions 10, the p-type base region 25, the $p^+$ type base contact region 24, and the $n^+$ emitter regions 26 are formed by known, standard manufacturing techniques such as oxidation, implantation, and diffusion. Subsequently, a Ti/Pt/Au layer is sputtered on the first side 4, as in the first example. This layer is patterned, whereby the conductor tracks 27 and 37 are formed. The track 27 connects the base contact regions 24 to the lead region 28, and the track 37 connects the emitter regions 26 to the lead region 38. A silicon nitride anti-scratch layer 20 is provided over these conductor tracks 27, 37. Then a UV-curing glue 11, in this case hexanediole diacrylate 1.6, and a covering plate 13 of Pyrex glass with a thickness of 1 mm are provided on the first side 4. The glue 11 is irradiated with UV through the glass plate 13. Then the slice 3 is thinned from the second side 5 down to a thickness of approximately 100 µm in a grinding process. The Pyrex glass plate 13 ensures that the slice 3 does not break during grinding. A Ti/Pt/Au layer is then sputtered on the second side 5, as in the first example. This layer is patterned by means of a mask, three regions 15 being created for each semiconductor element (see FIGS. 8 and 9). The slice 3 is then subjected to an etching treatment with KOH. The glass plate 13 screens the first side 4 of the semiconductor device during this. Individual package leads 22, 32, 42 are created thereby, i.e. one lead 22 for the base, one lead 32 for the emitter, and one further lead 42 for the collector for each semiconductor element. Then the individual semiconductor devices as shown in FIGS. 7 to 9 are formed by means of wire-sawing of the slice 3. The alignment for the sawing process is very simple because semiconductor elements are visible through the glass plate 13 and the glue 11. The semiconductor devices formed may be mounted with their second sides directly onto a printed circuit board, a foil, or something similar.

Figure 10:
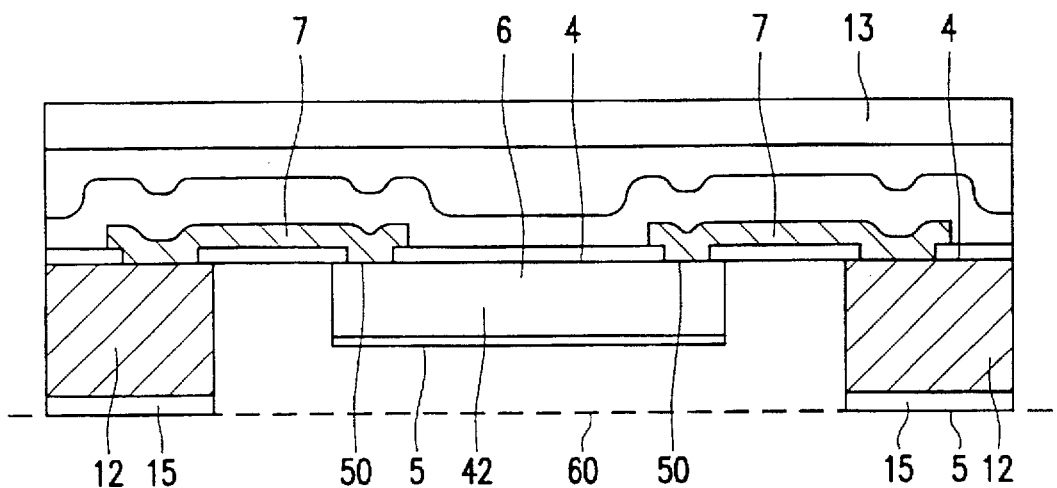
FIGS. 10 and 11 show a semiconductor device provided with an integrated circuit comprising many package leads, manufactured in accordance with the invention, FIG. 10 being a cross-section and FIG. 11 being a plan view of the first side.
Figure 11:
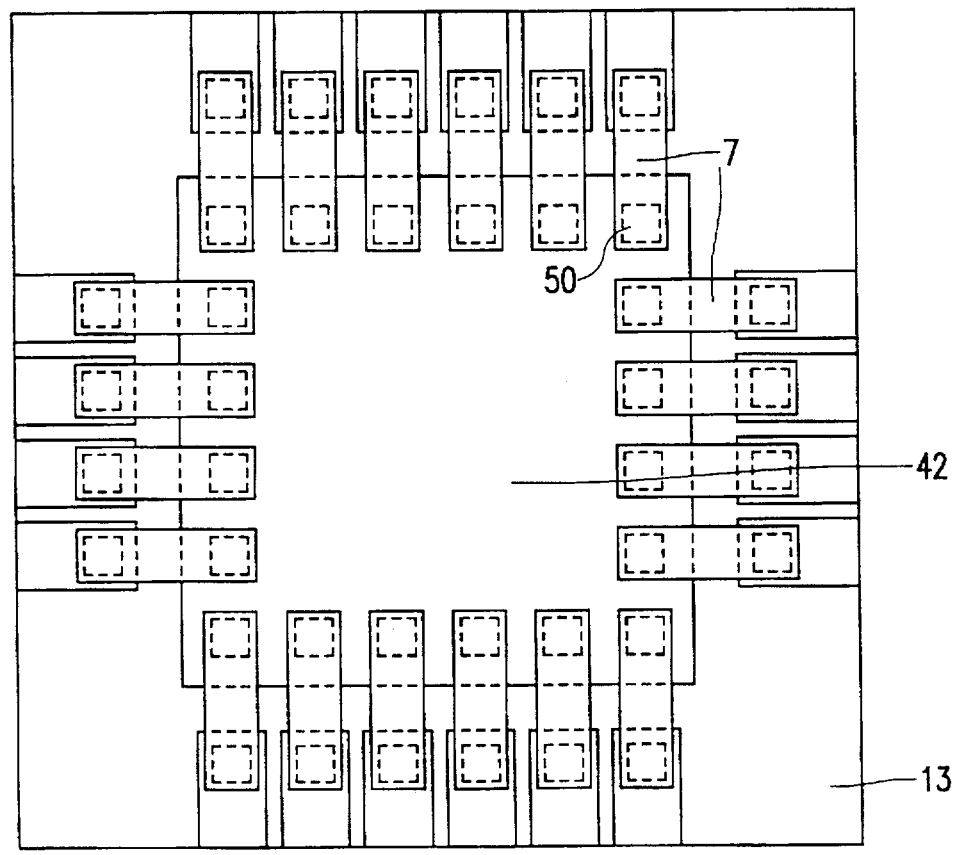

As a third embodiment, a semiconductor device provided with an integrated circuit according to the invention is shown. FIG. 10 shows a semiconductor device for surface mounting which comprises a covering plate 13 against which a body 42 of a semiconductor material and package leads 12 made from the semiconductor material are provided with a first side 4 of their two sides 4, 5, the body 42 being provided at its first side 4 with a semiconductor element 6 having contact regions 50 which are connected to the first side 4 of the package leads 12 via conductor tracks 7, while the second sides 5 of the package leads lie in one plane 60. In this example, the semiconductor element 6 comprises an integrated circuit (IC, not shown in FIGS. 10, 11). The package leads 12 are provided with an $n^+$ type doping and are manufactured from the same semiconductor slice as the body 42 with the integrated circuit 6. The arrangement and manufacture of the semiconductor device of this third embodiment of the invention are analogous to those of the first two embodiments. In the present example, the body 42 has been etched back further than the package leads 12 at its second side 5. The semiconductor device is mounted with its second side 5 on a printed circuit board, for example, in that a drop of conductive glue is provided on the second side 5 of the package leads 12 and the semiconductor device is then placed on a printed circuit board. The package leads 12 lie in a plane 60, so that the semiconductor device can make contact with conductor tracks on the printed circuit board with all its package leads 12. The portion 42 of the slice 3 in which the semiconductor element 6 is present does not make thermal or electrical contact with the printed circuit board after being mounted thereon.

Although certain techniques were used in the preceding embodiments, it will be obvious that alternative techniques may also be used without detracting from the invention. Thus the introduction of dopant atoms may take place through diffusion from a doped layer, or through implantation followed by an aftertreatment. The etching of semiconductor material by a wet-chemical method may be replaced by etching in a plasma. As an alternative to sawing of the slice 3, scribing and breaking may also be used. For more details on known techniques the reader is referred to handbooks such as S.M. Sze: "VLSI Technology", Mc-Graw-Hill Book Company, and S. Wolf: "Silicon Processing for the VLSI Era", vols. 1, 2, Lattice Press.

In the examples, the semiconductor devices are provided with diodes or transistors or integrated circuits (ICs). It is alternatively possible to manufacture other semiconductor elements such as, for example, thyristors, etc. Possibly, several further package leads provided with a semiconductor element may be present or may be manufactured per semiconductor device in addition to the package leads proreded with a lead region.

The lead regions may or may not be provided partly from the second side 5. Thus, for example, first a strongly doped contact region 19 adjoining the first side 4 may be formed, and later a strongly doped region adjoining the second side 5 and overlapping the contact region 19 may be provided from the second side by diffusion or implantation after the conductor track and the coating have been provided and the slice has been ground thinner. It is also possible for several rows of package leads next to one another to be provided. Complex integrated circuits may thus be provided with very many package leads. The conductor tracks 7 may alternatively be constructed as a multilayer wiring, so that crossing tracks are possible. The glass plate 13 may be provided with a layer impermeable to light, so that semiconductor elements which are sensitive to light can also be manufactured by the method according to the invention.

The semiconductor devices according to the invention may be mounted on many types of substrates by means of surface mounting, for example, on printed circuit boards, foils, ceramics substrates, etc.

It is also possible to provide the semiconductor devices with extra insulating layers. Thus, for example, the semiconductor surface may be passivated through the application of expoxy or glass in the cavities between semiconductor elements and lead regions after in the semiconductor elements and lead regions have been separated.

We claim:

1. A method of manufacturing a semiconductor device for surface mounting, said method comprising the steps of:

a) providing a slice of a semiconductor material having a first conductivity type and a first doping concentration throughout, said slice having a first side and a second side;

b) providing at least one semiconductor element at said first side comprising at least one of (i) a different doping level of the first conductivity type and (ii) a second conductivity type opposite the first conductivity type;

c) forming distinct lead regions at said first side of said first conductivity type having a higher doping concentration than said first doping concentration, said distinct lead regions extending through said slice from said first side to said second side;

d) forming an insulating layer on the first side;

e) forming conductor tracks on the insulating layer connecting the lead regions and corresponding ones of said semiconductor elements;

e) fixing a rigid plate to the insulating layer;

f) forming conductive contacts on the second side of the semiconductor slice connected to corresponding lead regions at said second side;

g) etching away the semiconductor material of said slice from the second side using the conductive contacts as a mask and the insulating layer as a stopper layer so as to form columns of semiconductor material comprising said lead regions extending from each said conductive contact to said insulating layer, with voids between said columns; and h) subdividing said slice into individual devices with package leads comprised by the columns of semiconductor material carrying the conductive contacts.

2. A method according to claim 1, wherein said conductive contacts comprise gold.

3. A method according to claim 2, wherein said semiconductor material comprises silicon and said insulating layer comprises silicon oxide.

4. A method according to claim 3, wherein said step of etching is done with KOH, said columns each having opposing sides each having a slope approximately 55 degrees to said second side of said semiconductor slice.

5. A method according to claim 1, wherein said semiconductor material comprises silicon and said insulating layer comprises silicon oxide.

6. A method according to claim 5, wherein said step of etching is done with KOH, said columns each having opposing sides each having a slope of approximately 55 degrees to said second side of said semiconductor slice.

7. A method according to claim 1, wherein after said step of fixing said rigid plate to said slice at said first side, said second side is reduced in thickness by a bulk reducing process over the entire second side.

8. A method according to claim 7, wherein said thickness of said slice is reduced to between a few tenths of microns and a few microns, said lead regions extending from said first side to said second side having a doping concentration of at least $10^{19}$ cm$^3$.

9. A method according to claim 1, wherein said rigid plate comprises one of a ceramic, a glass, or a silicon slice.

* * * * *